United States Patent
Zrinscak (10) Patent No.: US 12,382,729 B2
(45) Date of Patent: Aug. 5, 2025

(54) PROTECTION OF SPACE SOLAR CELLS IN AN ARRANGEMENT IN THE FORM OF A STRING

(71) Applicant: AZUR SPACE Solar Power GmbH, Heilbronn (DE)

(72) Inventor: Ivica Zrinscak, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 18/583,680

(22) Filed: Feb. 21, 2024

(65) Prior Publication Data
US 2024/0282873 A1    Aug. 22, 2024

(30) Foreign Application Priority Data
Feb. 21, 2023   (DE) .................. 10 2023 000 609.2

(51) Int. Cl.
*H10F 19/70*    (2025.01)
*H10F 19/90*    (2025.01)
*H10F 77/80*    (2025.01)

(52) U.S. Cl.
CPC ........... *H10F 19/70* (2025.01); *H10F 19/904* (2025.01); *H10F 77/80* (2025.01); *H10F 19/906* (2025.01)

(58) Field of Classification Search
CPC ...... H10F 19/70; H10F 19/904; H10F 19/902; H10F 19/00; H10F 77/80; H10F 19/75; H10F 19/80; H10F 19/906; H10F 77/63; H10F 19/20; H10F 10/142; H10F 19/30; H10F 19/31; H10F 19/50; H10F 77/147; H10F 77/935; H10F 10/10; H10F 19/90; H10F 19/908; H10F 71/00; H10F 77/169; H10F 77/219; H10F 77/488; H10F 77/955; H10F 77/00
See application file for complete search history.

(56) References Cited

U.S. PATENT DOCUMENTS

| | | | | |
|---|---|---|---|---|
| 3,912,539 | A | * 10/1975 | Magee | H10F 19/902 257/446 |
| 4,577,051 | A | * 3/1986 | Hartman | H10F 19/70 136/244 |
| 4,652,693 | A | * 3/1987 | Bar-On | H10F 77/937 136/251 |

(Continued)

FOREIGN PATENT DOCUMENTS

DE    102004044061 A1    4/2006

*Primary Examiner* — Golam Mowla
(74) *Attorney, Agent, or Firm* — Muncy, Geissler, Olds & Lowe, P.C.

(57) ABSTRACT

Protection of space solar cells in an arrangement in the form of a string extending in an X direction, and two directly adjacent space solar cells in the X direction in each case are electrically connected to each other in series with the aid of a metallic connector. The string has a first end and a second end opposite the first end, and a protection arrangement formed along a Y direction is formed on one of the two ends. The protection arrangement has a first string protection diode formed in the Y direction and a metal strip and a second string protection diode. The protection arrangement is electrically connected to one of the two ends of the string and each string protection diode is uncased and has exactly one metal contact on the upper side and exactly one metal contact on the underside.

15 Claims, 5 Drawing Sheets

(56) References Cited

U.S. PATENT DOCUMENTS

| | | | |
|---|---|---|---|
| 4,832,755 A * | 5/1989 | Barton | H10F 19/904 |
| | | | 136/251 |
| 6,034,322 A * | 3/2000 | Pollard | B64G 1/443 |
| | | | 136/244 |
| 6,262,358 B1 | 7/2001 | Kamimura et al. | |
| 6,563,289 B1 * | 5/2003 | Cross | H10F 19/50 |
| | | | 257/E31.038 |
| 6,784,358 B2 * | 8/2004 | Kukulka | H10F 19/50 |
| | | | 136/249 |
| 7,732,706 B1 * | 6/2010 | Mardesich | H10F 19/75 |
| | | | 136/261 |
| 8,809,671 B2 * | 8/2014 | Linderman | H10F 19/75 |
| | | | 136/246 |
| 9,217,582 B2 * | 12/2015 | Frazier | F24S 30/42 |
| 9,356,184 B2 * | 5/2016 | Morad | H10F 19/807 |
| 9,397,611 B2 * | 7/2016 | Judkins | H02S 50/00 |
| 9,608,156 B2 * | 3/2017 | Clevenger | H10F 19/85 |
| 9,627,565 B2 * | 4/2017 | Hoang | H10F 19/902 |
| 10,074,761 B2 | 9/2018 | Hilgarth et al. | |
| 10,084,104 B2 * | 9/2018 | Morad | H02S 40/34 |
| 10,658,533 B2 * | 5/2020 | Tourino | H10F 19/902 |
| 11,495,701 B2 * | 11/2022 | Waterman | H10F 19/00 |
| 11,817,514 B2 * | 11/2023 | Bardfield | H10F 77/68 |
| 2003/0029494 A1 * | 2/2003 | Ohkubo | H10F 19/904 |
| | | | 136/255 |
| 2004/0089339 A1 * | 5/2004 | Kukulka | H10F 19/50 |
| | | | 136/258 |
| 2005/0133086 A1 | 6/2005 | Itoyama et al. | |
| 2009/0283137 A1 * | 11/2009 | Croft | H10F 19/00 |
| | | | 136/251 |
| 2010/0122730 A1 * | 5/2010 | Corneille | H01C 7/027 |
| | | | 136/259 |
| 2011/0108084 A1 | 5/2011 | Tisler et al. | |
| 2018/0062011 A1 | 3/2018 | Crist | |

\* cited by examiner

PROTECTION OF SPACE SOLAR CELLS IN AN ARRANGEMENT IN THE FORM OF A STRING

This nonprovisional application claims priority under 35 U.S.C. § 119(a) to German Patent Application No. 10 2023 000 609.2, which was filed in Germany on Feb. 21, 2023, and which is herein incorporated by reference.

BACKGROUND OF THE INVENTION

Field of the Invention

Solar cells for applications in space are designed as so-called III-V multijunction solar cells, i.e., having multiple series-connected p/n junctions, due to the high-efficiency requirements. At least three p/n junctions, stacked one on top of the other, are currently integrated in a monolithic manner. In the case of the III-V multijunction solar cells, the bottom-most p/n junction is generally formed by a germanium substrate cell.

Description of the Background Art

In contrast to the solar cells for terrestrial applications, which are almost exclusively designed as single-junction cells made from silicon and in modules of a large, rigid rectangular design, entirely different requirements are imposed on the designs of space solar cells. Important conditions for space solar cells are, among other things, the lowest possible weight, an efficiency above 30%, very high reliability and robustness over the wide temperature range, resistance to shocks and also to high doses of proton and electron radiation. In that a dissipation of heat, i.e., a cooling of electrical components, is possible only in the form of radiation in the vacuum of outer space, the heat removal of electrical components is much more complex than in terrestrial applications.

As a result, the manufacture and structural design technology for modules for space solar cells, i.e., the type of panels, developed in a manner entirely separate and different from the manufacture and structural design technology of terrestrial solar cell modules.

Space solar cells are thus arranged consecutively in individual rows, also referred to as strings, once they have been reduced to a thickness of less than 150 μm. The space solar cells are welded to each other along the string and electrically series-connected hereby, using special, also very light-weight and flexible metal connectors. The rows are flexible along the longitudinal direction and are arranged on ultra-lightweight, rigid carbon fiber-reinforced panels or on thin, flexible carrier films.

A panel generally comprises multiple strings. On a panel, multiple strings are connected to each other in series and/or in parallel on the back of the particular panel, using flexible cables. The panel has a cable harness on the back for this purpose. Further electrical components are also arranged on the back of the panel.

In contrast to the designs for space solar cells mentioned above, terrestrial solar cells are rigidly arranged on a mechanically rigid, heavy, and stable carrier plate and covered overall with a rigid, in particular hail-proof, glass plate. For a single panel, the glass plate is arranged on a circumferential frame, each panel being designed to be impermeable to environmental influences with the aid of the frame and with the aid of adhesive, in particular silicone.

The total weight of a panel for terrestrial solar cells is higher by many magnitudes than an ultra-lightweight panel for space solar cells. Moreover, defective panels in terrestrial applications are easy to replace. A panel for terrestrial solar cells therefore has only a few protection diodes.

In contrast, in the case of the panels for space, each individual space solar cell has its own bypass diode, so that, in the case of a failure of one space solar cell, not all space solar cells of the particular string fail, i.e., the entire string does not fail.

In the case of the space solar cell, the assigned bypass diodes are usually arranged in one of the two cut-away corners, the so-called "cropped corners." Each bypass diode is connected directly to the particular space solar cell with the aid of a metallic connector. The connectors are always welded for reasons of reliability.

To protect the space solar cells against cosmic radiation, the fronts of each of the space solar cells and the bypass diodes arranged in the corner are protected against shortwave UV light with the aid of a separate, very thin cover glass.

The ultra-thin cover glasses each have a thickness of less than 0.2 mm and are bonded to the front of the space solar cell with the aid of an adhesive. The bypass diodes arranged in the "cropped corners" are also covered by the cover glass of the assigned space solar cell. In other words, the bypass diodes do not have their own, i.e. a separate, cover glass.

A disadvantage of the arrangement mentioned above is that, in the case of a fault in the pair made up of a space solar cell and the assigned bypass diode, individual parts of the pair may be replaced only with a great deal of effort.

If the space solar cells are already arranged on the string, a replacement of a defective part on the string is even more complicated, so that the entire string is defective and must as a whole be replaced with another string. In other words, a repair or reworking is not economically sensible.

An arrangement of space solar cells is known from DE 10 2004 044 061 A1, which corresponds to US 2008/0000523. The space solar cells are in the form of a string. As discussed above, each of the space solar cells includes a bypass diode arranged in the corner of the space solar cell, the bypass diode being electrically connected in each case antiparallel to the particular space solar cell and is protected with the aid of the shared cover glass.

In addition to the particular bypass diodes, each string of space solar cells contains one or multiple encased or encapsulated string protection diodes, i.e., surrounded by molding compound. The function of the string protection diode is to suppress currents in an opposite direction compared to the normal operation, i.e., in a reverse direction, to reduce power losses hereby.

The string protection diodes are connected in series to the space solar cells of a string in a conducting direction, i.e., in a forward direction. In other words, upon an irradiation by the sun, current of low ampere, typically 1.5 A, is generated by the space solar cells arranged on the string, the entire current then flowing through the string protection diode polarized in the forward direction.

Voltages between 10 V and 100 V generally occur in the reverse direction, in particular if, for example, one of the multiple interconnected strings is not exposed to incident sunlight, or only to a limited degree, and one of the other strings is exposed to the full incident sunlight. A current flow through the strings situated in the dark is suppressed by the string protection diode, which is now polarized in the reverse direction.

For reasons of reliability and flexibility, in the designs in use, one or multiple encased string protection diode(s) is/are arranged on the back of the panel for each string and connected to the string on the front of the panel with the aid of flexible electrical cables. Due to the arrangement, the encased string protection diodes on the back of the panel are protected against an additional heat input from the sun, so that the heat removal at a higher current load does not become problematic.

It should be noted that, due to the lack of convection in space, a passive cooling takes place only in the form of radiant heat, only little energy being able to be emitted at the maximum temperatures of less than or equal to 170° C. permissible for the string protection diodes, which are usually designed as Si diodes.

For reasons of redundancy and/or to reduce heat development, multiple string protection diodes are often connected in parallel.

An integrated arrangement of string protection diodes arranged on the front is known from US 2018/0062011 A1, in particular FIG. 3a and FIG. 3b and FIG. 4a and FIG. 4b. For each string, one or multiple string diodes is integrated on the end of each string in a second corner of the space solar cell arranged on the end of the string, similarly to the integrated arrangement of the bypass diode. The second corner and the first corner are arranged on the same side of the space solar cell.

A back or a front of the string protection diode is electrically connected in series to the back or front of the directly adjacent space solar cell with the aid of a further metallic connector. A second contact is formed on the upper side of the string protection diode. The second contact is connected to a continuous, rectangular metallic contact part on the end of the space solar cell string via a further connector. Similarly to the bypass diode, the string protection diode is also glued to the cover glass of the directly adjacent space solar cell.

As already discussed above, the string protection diode is integrated along with the particular space solar cell, similarly to the bypass diode, i.e., the string protection diode is arranged on a plastic carrier film or on the panel together with the space solar cell.

The manufacture of strings is made much more complex hereby, since the string protection diodes, in particular, must be designed to be much larger and more powerful compared to the bypass diodes, in order to withstand the current load of the entire string in the forward direction with as few electrical losses as possible.

In other words, the amount of space in the corners of the space solar cells is extremely limited. It has also been shown that a triangular design is impractical, due to the additional effort required for sawing the string protection diodes out of the Si production substrate.

Moreover, the irradiation of the sun in space is much more intensive than on the earth. A cooling of the string protection diodes with the intensive incident sunlight is often insufficient, particularly in the operating mode, in which the high currents flow through the string protection diodes. If the temperature in the Si string protection diodes increases in the vicinity of 150° C., the electrical power loss in the string protection diodes additionally increases, which may result in a failure.

Those skilled in the art furthermore know that rejects also increase during string manufacturing. Due to the high level of integration, in particular, a repair, i.e. reworking, in the case of faults in the connection of the string protection diode to the space solar cell or in the case of faults in the protection diodes, may not be carried out both economically as well as due to the high reliability requirements.

Due to the disadvantages mentioned for an integrated arrangement on the front of the panel, the discrete arrangement of the string protection diodes described above on the back of the panel, using flexible cables, is employed for the manufacturing of space solar panels.

Figure 4:
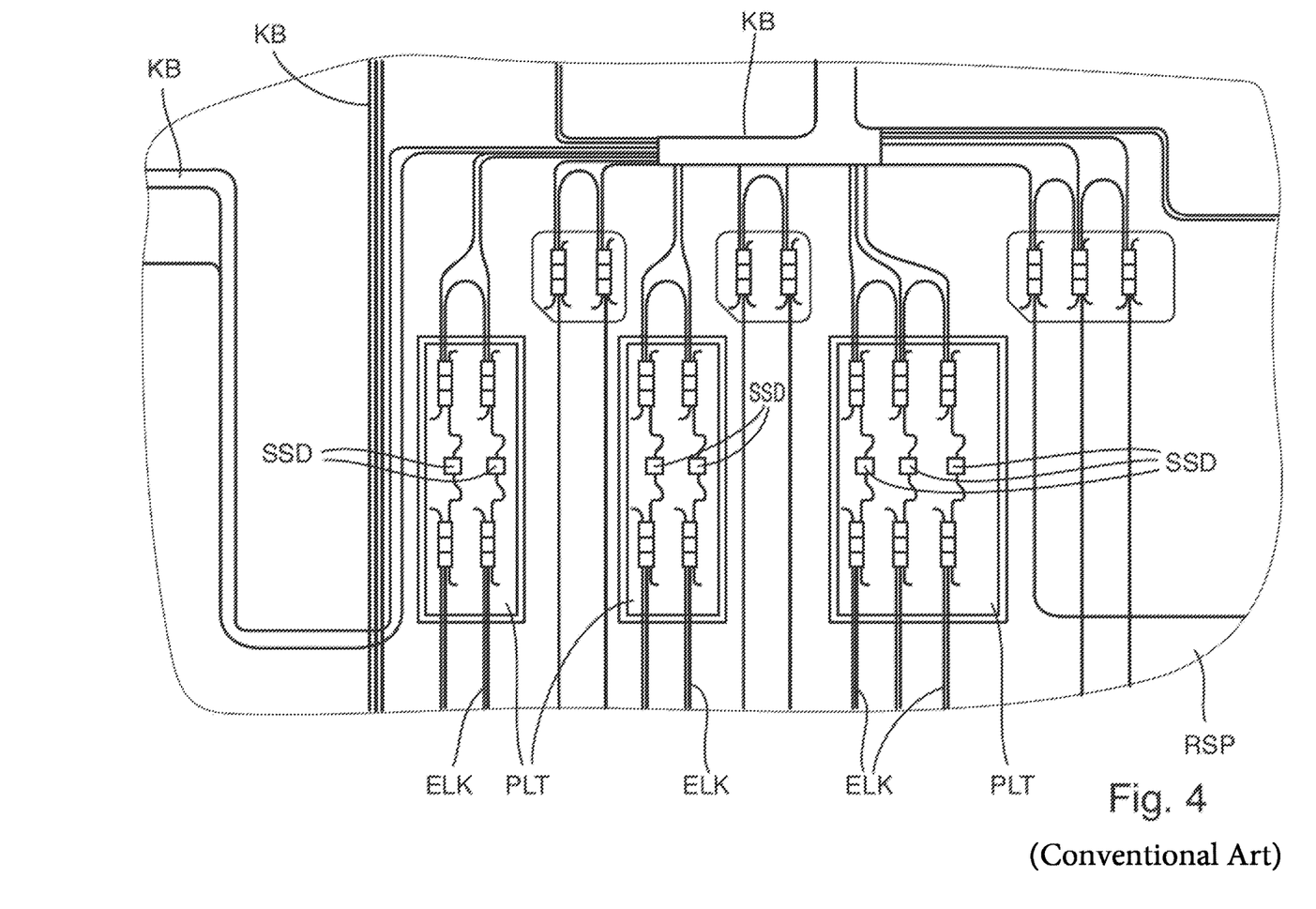
FIG. 4 shows a top view of a string protection diodes on the back of a panel according to the conventional art.

An example of this type is illustrated in FIG. 4. A detail of the back of a panel for space applications is shown. The individual strings formed on the front of the panel are each connected with the aid of a multiplicity of flexible cables ELK on the back of printed circuit boards PLT. The multiplicity of cables ELK are combined in the form of cable harnesses KB. Individual encased string protection diodes SSD are arranged on the larger printed circuit boards PLT.

It is understood that a common structure illustrated in FIG. 4 requires a certain complexity and causes a certain amount of additional weight.

SUMMARY OF THE INVENTION

It is therefore an object of the invention to provide a device which refines the prior art.

In an example, an arrangement for protecting space solar cells is provided, at least a portion of the space solar cells being arranged in rows along an X direction in the form of a string.

Longer strings formed in the X direction, for examples panels due to the geometric requirements, may also be arranged in multiple rows situated side by side and connected in series.

The string comprises at least two space solar cells arranged one after the other, the space solar cells directly adjacent along the X direction being electrically connected to each other in series with the aid or one or multiple connectors.

The space solar cells each have a receiving surface formed in an X direction and in a Y direction.

The string also has a front and a back, the receiving surfaces of the space solar cells being formed on the front of the string.

The string further can have a first end and a second end opposite the first end, the two ends each extending in the Y direction along a side of the space solar cell arranged on the ends of the string.

Each space solar cell includes a bypass diode connected to the particular space solar cell, the space solar cells each having a thickness formed in a Z direction between 30 μm and 300 μm or a thickness between 50 μm and 160 μm.

A protection arrangement is furthermore formed on the front on at least one of the two ends along the Y direction, the protection arrangement being electrically connected to the space solar cell of the string arranged on the end with the aid of one of the metallic connectors.

The protection arrangement can comprise a first string protection diode and a metal strip and a second string protection diode. The metal strip has a first head-side end and a connection piece and a second head-side end.

The first string protection diode can be connected in series in the Y direction to the first head-side end of the metal strip with the aid of one of the metallic connectors.

The second string protection diode can also be connected in series in the Y direction to the second head-side end of the metal strip with the aid of one of the metallic connectors.

The connectors can each have two contact surfaces spaced a distance apart from each other by a connection piece.

The first string protection diode can be alternatively arranged directly on the first head-side end of the metal strip, and the second string protection diode is arranged directly on the second head-side end of the metal strip.

In both examples, the two string diodes can each be electrically connected in series in the X direction to the space solar cell arranged on the end of the string with the aid of one of the metallic connectors.

Further, the string protection diodes can each be connected to a flexible connecting cable with the aid of one of the metallic connectors, the metal strip being singly or multiply connected in the X direction to the space solar cell arranged on the one end of the string with the aid of the connectors.

Each string protection diode can be uncased and can have exactly one p/n junction and a metal contact on an upper side and a metal contact on an underside.

The metal contacts each may cover at least 50% of the total surface area of the upper side and the underside.

Each string protection diode can further have its own, i.e. separate, cover on the upper side, the cover being glued to the upper side of the string protection diode.

The string protection diode can be designed overall to be flat and has a thickness of less than 1 mm formed in a Z direction.

In the Y direction, the extension of the entire protection arrangement can be greater than the extension in the X direction at least by a factor of five.

It has surprisingly been shown that an integration of the string protection diode using the present arrangement on the front of the string is of considerable advantage.

For example, an advantage of the protection arrangement is that the connection complexity on the back of the string or the panel is substantially reduced.

Due to the advantageous arrangement of the two string protection arrangements in connection with the metal strip, it is also possible to replace the individual string protection diode in the event of a defect during manufacturing without mechanically influencing the string.

It has also been shown that, due to the advantageous integration of the string protection diodes in connection with the metal strip, the manufacturing costs may be reduced and the reliability increased.

Because the string protection diodes are bonded directly to the metal strip or are connected directly to the metal strip with the aid of a wide-area connector, the string protection diodes also do not become too hot even at maximum power and direct irradiation by the sun.

Along with the good thermal coupling, the high reflectance of the metal surface on the upper side of the string protection diode is also important for this purpose. The total reflectance of the arrangement in the visible and infrared range is preferably above 80% or above 90%. It is advantageous if the cover layer is permeable to infrared radiation, i.e. transparent, for the purpose of removing the heat from the string protection diodes by means of dissipation in the infrared range.

The upper side of the string protection diode can have a metallic layer which is continuous or covers more than 80% of the surface for the purpose of reflecting the solar radiation or effectively dissipating the heat of the component.

The distance in the X direction between the space solar cell arranged on the end of the string and the protection arrangement can be in a range from 0.01 mm to 2.0 mm or in a range between 0.1 mm and 1 mm or in a range between 0.2 mm and 0.5 mm.

The receiving surface of the space solar cell is furthermore between 4 $cm^2$ and 500 $cm^2$ or between 30 $cm^2$ and 350 $cm^2$ or between 70 $cm^2$ and 160 $cm^2$ in each case.

It should be noted that the term "metallic connector" can be understood to be one which comprises a connector or is made from a metal. In particular, a metallic connector also can comprise a multilayer structure, for example made up of one and one or multiple organic carrier layers or multiple metal layers and at least one organic carrier layer or multiple different metal layers and one or multiple organic carrier layers.

The term "connected" can also be understood to be an electrical connection.

The electrical connection between the string protection diode and the first contact surface of the connector and/or the electrical connection between the second contact surface and the metal strip or the space solar cell is/are designed to be materially bonded in each case.

The contact resistance in the electrical connection can be less than 10 ohms or less than 5 ohms or less than 1 ohm.

Because a string contains a large number of space solar cells, the electrical power data of the string protection diode must be adapted to the electrical data of the space solar cell string. In other words, the current carrying capacity of the string protection diode should be at least 50% higher than that maximum current of the string in full incident sunlight and generally has few amperes.

The current carrying capacity of the string protection diode is preferably in a range between 100 mA and 10 A or between 1 A and 5 A.

The string protection diodes can be made from silicon or GaAs.

An advantage of GaAs over Si silicon is that it has less of a voltage drop in the forward direction.

In an example, "Kovar" material can be used as the connector or as the metal strip.

In an example, the connector and/or the metal strip can comprise more than 50% iron and preferably more than 20% cobalt and preferably more than 10% nickel.

An "Invar" connector can be used as the connector.

The connector and/or the metal strip comprise(s) or can be made up of pure silver and/or comprise(s) molybdenum, the molybdenum preferably being coated with silver on one side or both sides.

To form a reliable electrical and mechanical connection, the connectors preferably have metal lugs. In particular, the metal lugs are designed for welding processes.

The connectors of the protection arrangement can be precisely welded to one end of the string multiple times, i.e. between two and six times. It is understood that the welds may each be spaced a distance apart from each other in the Y direction.

The contact surfaces or the contact lugs of the connectors on the one end of the string can be welded to the space solar cell and/or the bypass diode arranged on the end at precisely two contact points spaced a distance apart from each other in the Y direction. The distance between the two contact points in the Y direction is a multiple of the distance of the particular contact point from the edge of the space solar cell formed along the X direction.

In other words, the two welds for the connection to the string protection diodes are arranged in the vicinity of the particular outer edge of the string formed in the X direction.

Each of the string protection diodes comprises at least two string protection diodes electrically connected in parallel to each other. The two parallel-connected string protection diodes are preferably arranged in parallel in the X direction, spaced a distance apart from each other in the Y direction. An advantage is that, with the aid of the parallel connection, an easy redundancy is given if one of the string protection diodes fails.

In an example, exactly four string protection diodes are arranged per string, i.e., connected to the string. In each case, two of the string protection diodes are connected in series and form two branches in parallel to each other, the two nodes of the branches being connected directly to each other, i.e., short-circuited with respect to each other.

An advantage despite the slightly higher resistance of the series connection in the forward direction is that, due to the higher, i.e. more than double, redundancy, the particular string is still protected by one or multiple string protection diodes in the reverse direction even if more than one string protection diode fails.

In an example, two string protection diodes, each connected in parallel to each other, can be formed at both ends. A series connection made up of a string protection diode, space solar cell of the string or the bypass diodes and string protection diode is formed.

An advantage is that the reliability is further increased, compared to the specific embodiment having only two string protection diodes, due to the more than double redundancy. The string protection diodes preferably have the same electrical data among each other or, in a first approximation, almost the same electrical data.

In an example, two string protection diodes connected in series to each other can be formed instead of a single string protection diode. The one or both of the series-connected string protection diodes can be formed from a combination of series- and parallel-connected string protection diodes. An advantage is that a higher reverse voltage may be easily achieved in the reverse direction with the aid of the series connection.

The string protection diode can be made from silicon or from GaAs.

The string protection diode can have a reverse voltage range between 10 V and 1000 V, or between 30 V and 600 V or between 80 V and 300 V or between 10 V and 300 V.

The string protection diodes can have a current range between 0.1 A and 5 A or between 0.5 A and 2 A.

In an example, only III-V multijunction space solar cells can be arranged as space solar cells on the string.

In an example, at least two and no more than twenty III-V multijunction space solar cells can be electrically connected in series on a string.

The series connection of the space solar cells can comprise or is made up of five space solar cells or ten space solar cells or twenty space solar cells.

The series connection can comprise or is made up of a total of no more than forty or no more than one hundred series-connected space solar cells.

The series-connected space solar cells can be distributed to at least two or three strings. At most, the series-connected space solar cells can be distributed to ten strings.

Also, a string, hereinafter also referred to as an overall string, can be divided into multiple subparts situated directly next to each other, the subparts being series-connected to each other, and the first end then no longer being situated opposite the second end in the X direction. It is understood that the two subparts are preferably arranged in parallel to each other and spaced a distance apart from each other in the Y direction. It should also be noted that the two subparts of the overall string are designed to be of the same length or not of the same length.

The receiving surfaces of the space solar cells are formed exclusively in parallel to the X direction and in parallel to the Y direction. In other words, the receiving surfaces are preferably situated in an X-Y plane.

The connectors can have a first contact surface and a second contact surface, one of the two contact surfaces being connected to the metal contact on the underside of the string protection diode or to the metal contact on the upper side thereof, and the other of the two contact surfaces being connected to the metal strip.

The two contact surfaces for the connectors can be provided with the same design or different designs. In another refinement, at least one of the two contact surfaces of the connectors or both contact surfaces each have a contact lug or multiple contact lugs.

The connecting piece between the two contact surfaces can be provided with a meander-shaped design, at least in a portion of the connectors, for the purpose of mechanically decoupling the two contact surfaces from each other.

The term meander-shaped clarifies that, in the case of the connectors, the connecting piece joins the two contact surfaces transversely to a straight line, has a greater extension than in the direction of the straight line, and optionally has multiple bulges and recesses transversely to the direction of the straight line.

In other words, the connecting piece resembles the shape of a meander in some examples of the connectors.

The two contact surfaces of the connectors can each be provided with a flat design and have a thickness formed in the Z direction between 0.01 mm and 0.7 mm. The thickness of the contact surfaces is preferably constant over the extension.

The connectors can have a rectangular surface, the long side of the rectangular surface having a greater extension than the short side by a factor of at least 5.

All space solar cells of the string can each have a bypass diode, the bypass diode being connected directly to the particular space diode.

One of the two string protection diodes can be connected directly to the bypass diode of the space solar cell arranged on one of the two ends.

A protection arrangement can be formed on both ends of the string. The advantage of this is that the redundancy increases hereby if a part of or the complete protection arrangement formed on one of the two ends fails.

In the case of a light incidence upon the front of the space solar cells, a current generated in the space solar cells with the aid of the light incidence may flow only through the string protection diodes and the metal strip to the connecting line.

The contact lugs can have a thickness between 0.01 mm and 0.5 mm or between 0.02 mm and 0.2 mm.

The cover of the string protection diode can have a high transmission in the infrared range or is transparent in the infrared range, for the purpose of reflecting the thermal radiation or to not suppressing the dissipation of heat from the string protection diode.

The protection arrangement can be formed directly on one of the two ends, the distance in the X direction between the protection arrangement and the space solar cell connected to the protection arrangement being in a range between 10 μm and 10 mm or in a range between 100 μm and 2 mm. The distance between the space solar cell and the protection arrangement is determined in each case by the length of the connecting piece of the connectors in a first approximation.

A cooling for the string protection diodes can be formed with the aid of the metal strips and/or the connecting line.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In the present case, space solar cells WSZ having a so-called n-on-p design are used. Space solar cells WSZ have an upper side oriented in the direction of the incident sunlight and an underside opposite thereto. The n emitter is formed on the upper side of the space solar cell.

Space solar cells WSZ are each furthermore designed as III-V multijunction cells. The space solar cells generally comprise a germanium cell formed in a germanium substrate.

Planar space solar cells WSZ arranged along a line have a first head-side end, at which a positive potential + is present upon incident sunlight, and second head-side end, at which a negative potential − is present.

It should be noted that negative potential—may also be formed at the first head-side end, and positive potential + may be formed at the second head-side end.

It is understood that space solar cells WSZ have a p-on-n design in an alternative design.

Figure 1A:
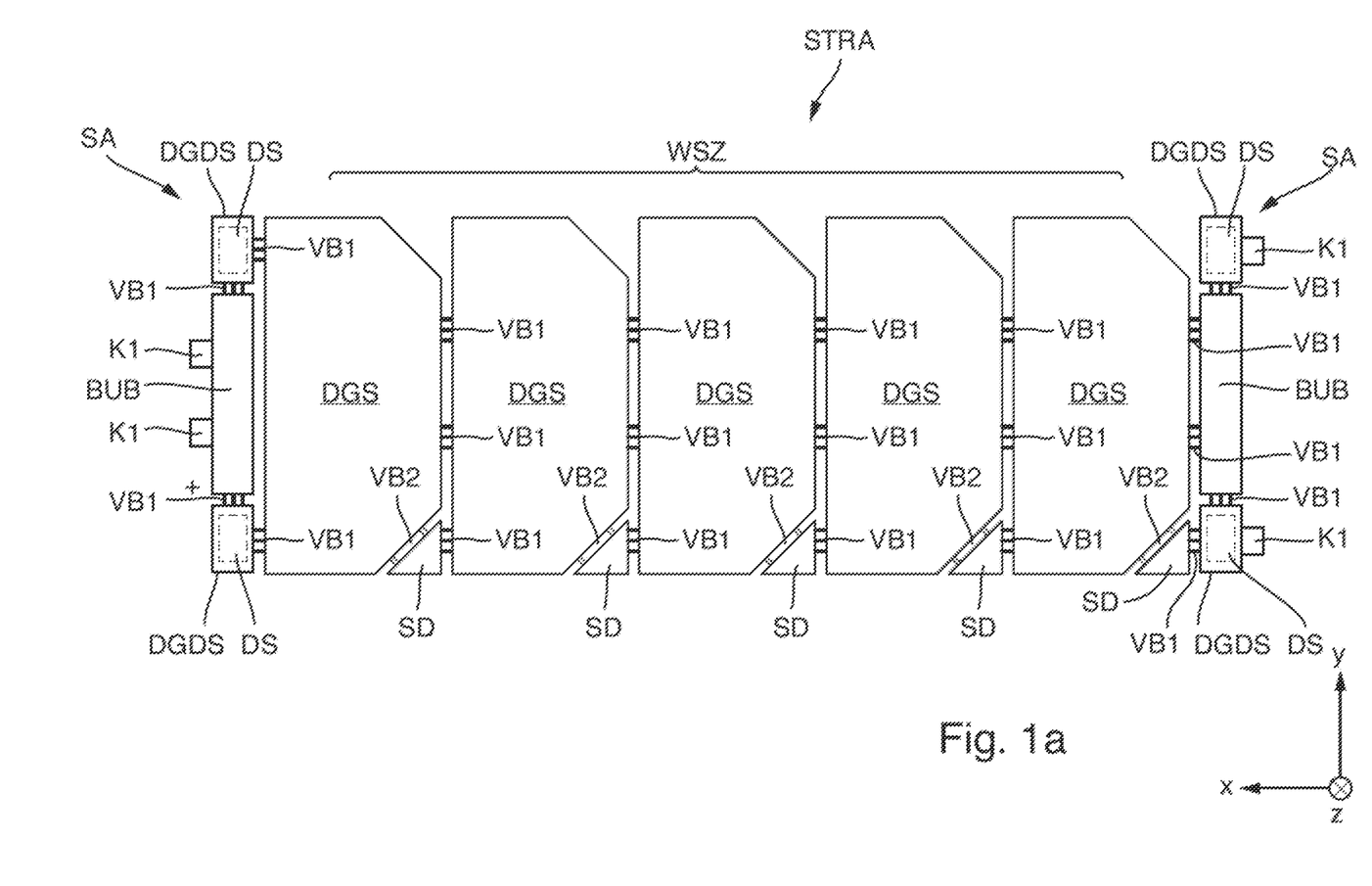
FIGS. 1a and 1b show different examples of a string of space solar cells connected to a protection arrangement formed on one of the two ends, each including one of the space solar cells arranged on the particular end.
Figure 1B:
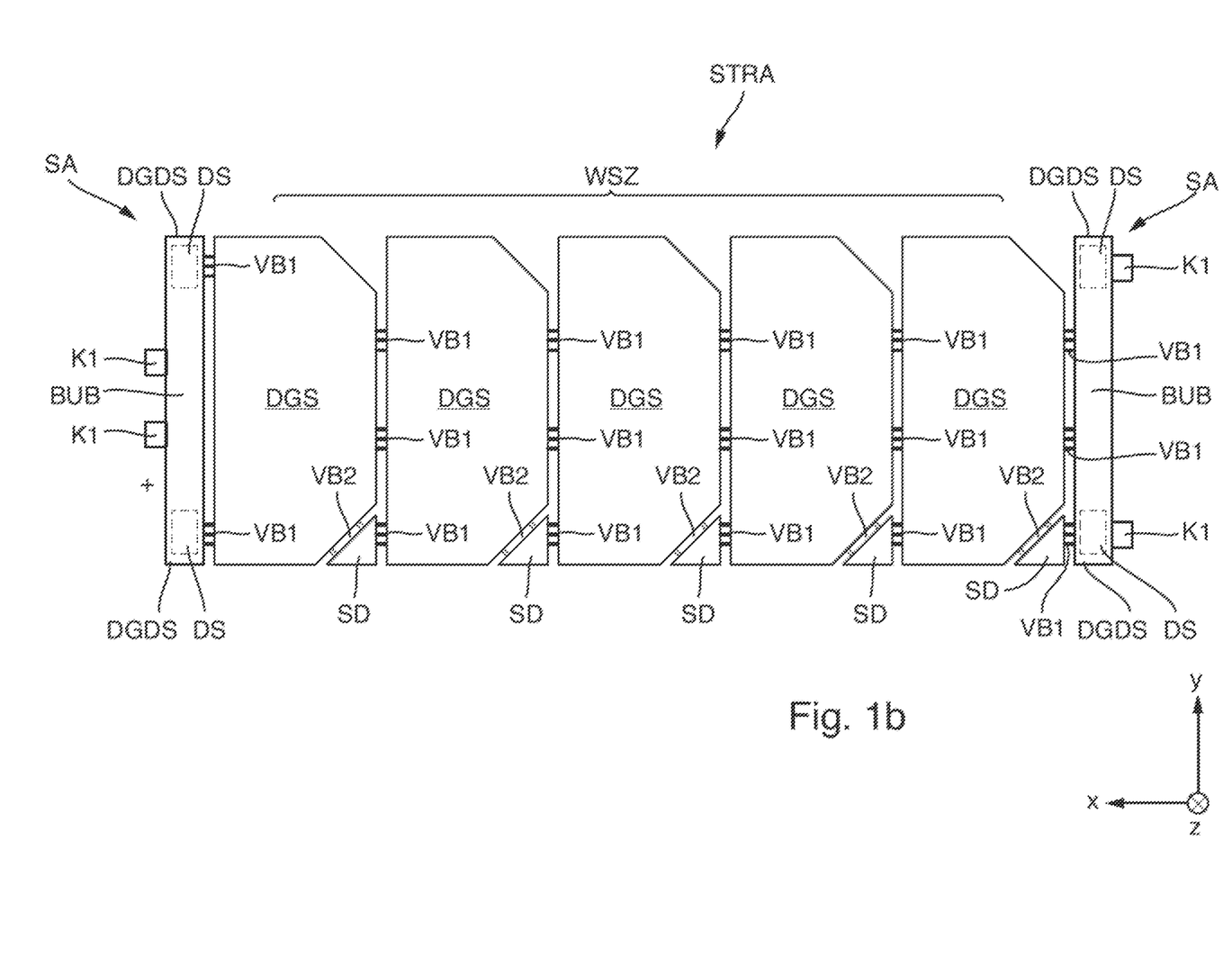

The illustrations in FIG. 1a and FIG. 1b show different designs of the arrangement of space solar cells WSZ in the form of a string STRA, including a protection arrangement SA formed on both ends, particular protection arrangement SA being connected to space solar cell WSZ arranged on the particular end.

Protection arrangement SA is designed overall to be flat and has a thickness of less than 1 mm formed in a Z direction.

The extension of entire protection arrangement SA has an extension in the Y direction which is greater than in the X direction at least by a factor of five.

One of the two ends of protection arrangement SA is designed as a positive voltage pole + and the other end as a negative voltage pole −.

However, it is understood that, in a specific example, only one protection arrangement SA may be formed either on the end having positive voltage pole + or on the end having negative voltage pole −.

In the present case, space solar cells WSZ are arranged one after the other in the form of string STRA extending in the X direction, string STRA comprising a total of five space solar cells WSZ. Each of the five space solar cells WSZ is protected by its own cover glass DGS on an upper side.

In each case, two directly adjacent space solar cells WSZ in the X direction are electrically series-connected to each other with the aid of exactly two metallic connectors VB1.

Space solar cells WSZ each have a receiving surface formed in an X direction and in a Y direction.

String STRA has a front and a back, the front being illustrated in the depicted top view.

In the present case, the receiving surfaces of space solar cells WSZ are formed on the front of string STRA.

String STRA has a first end and a second end opposite the first end, the two ends each extending in the Y direction along a side of space solar cell WSZ arranged on the ends of the string.

In the present case, each of space solar cells WSZ includes a bypass diode SD connected to particular space solar cell WSZ. Bypass diodes SD in each case are arranged in a corner of assigned space solar cell WSZ and connected to directly adjacent space solar cell WSZ in the X direction and in the Y direction with the aid of two connectors VB1, VB2.

It is understood that bypass diode SD and assigned bypass diode SD in the X direction, i.e., the one directly connected to space solar cell WSZ, are covered by a single cover glass DGS.

Each space solar cell WSZ has a thickness between 30 μm and 300 μm or a thickness between 50 μm and 160 μm in a Z direction.

Protection arrangements SA arranged on the front of string STRA are each formed along the Y direction.

Protection arrangements SA are electrically connected to space solar cells WSZ of string STRA arranged on the two ends with the aid of multiple metallic connectors.

Protection arrangement SA comprises a first string protection diode DGDS and a metal strip BUB and a second string protection diode DGDS. It is furthermore preferred to form contact lugs having contact surfaces K1 on the metal strip, the contact lugs and the metal strips being generally designed as a single piece.

Metal strip BUB has a first head-side end and a connection piece and a second head-side end.

In the specific embodiment illustrated in FIG. 1a, also referred to as the first alternative, first string protection diode DGDS is connected in series in the Y direction to the first head-side end of metal strip BUB with the aid of one of metallic connectors VB1.

Second string protection diode DGDS is also connected in series in the Y direction to the second head-side end of metal strip BUB with the aid of one of metallic connectors VB1.

Connectors VB1 each have two contact surfaces spaced a distance apart from each other by a connection piece.

In the case of protection arrangement SA connected to the end where positive potential + is present, the two string protection diodes DSGS are each connected to space solar cell WSZ with the aid of a connector VB1 formed in the X direction. In other words, the two branches of string protective diodes DGDS are in parallel to each other and thus form a redundancy.

Metal strip BUB includes two contact lugs K1 for connecting one flexible cable in each case. In other words, each of the connections is preferably joined with the aid of exactly one flexible cable.

It should be noted that, in each of the branches, the flexible cable can be connected in series to metal strip BUB and string protection diode DGDS and space solar cell WSZ via contact lugs K1.

In the case of protection arrangement SA connected to the end where the negative potential is present, the two string protection diodes DSGS are each connected to a flexible cable via one of particular contact tabs K1 with the aid of a connector VB1 in the negative X direction.

One of string protection diodes DGDS s also connected to the bypass diode of space solar cell WSZ with the aid of one of connectors VB1. Metal strip BUB in the present case is connected to space solar cell WSZ formed on the end of the string with the aid of two connectors VB1. It is understood that the risk of a failure is diminished and the series resistance reduced with the aid of a larger number of connectors VB1 connected in parallel to each other.

In addition, first string protection diode DGDS and second string protection diode DGDS are also connected in series to the first head-side end of metal strip BUB or to second head-side end of metal strip BUB in the Y direction with the aid of at least one metallic connector VB1.

In this case as well, the two branches of string protective diodes DGDS are situated so as to be connected in parallel to each other and thus form a redundancy. In other words, the reliability is increased.

It should be noted that, in each of the two branches, space solar cell WSZ is connected in series to string protection diode DGDS and to the flexible connecting cables via metal strip BUB.

In the specific embodiment illustrated in FIG. 1*b*, also referred to as the second alternative, only the differences from the specific embodiment are discussed which are explained in connection with the drawings in FIG. 1*a*.

On the first head-side end where positive potential + is present, first string protection diode DGDS is arranged directly on metal strip BUB without connector VB1. This makes it possible to do without two connectors VB1, compared to the specific embodiment illustrated in FIG. 1*a*.

In addition, second string protection diode DGDS is arranged directly on metal strip BUB on the second head-side end.

In the two alternatives illustrated in FIG. 1*a* and FIG. 1*b*, the two string protection diodes DGDS are each electrically connected in series in the X direction to space solar cell WSZ arranged on the end of string STRA with the aid of one of metallic connectors VB1.

It should be noted that, in the present case, string protection diodes DGDS each have their own cover in the form of a cover glass. It is understood that the cover is glued to individual string protection diode DGDS in each case.

In the illustrations in FIGS. 2*a* through 2*e*, detailed views, among other things, of the front, the side, and the back of protection arrangement SA connected to a space solar cell WWSZ are shown.

Figures 2A, 2B, 2D, 2E:
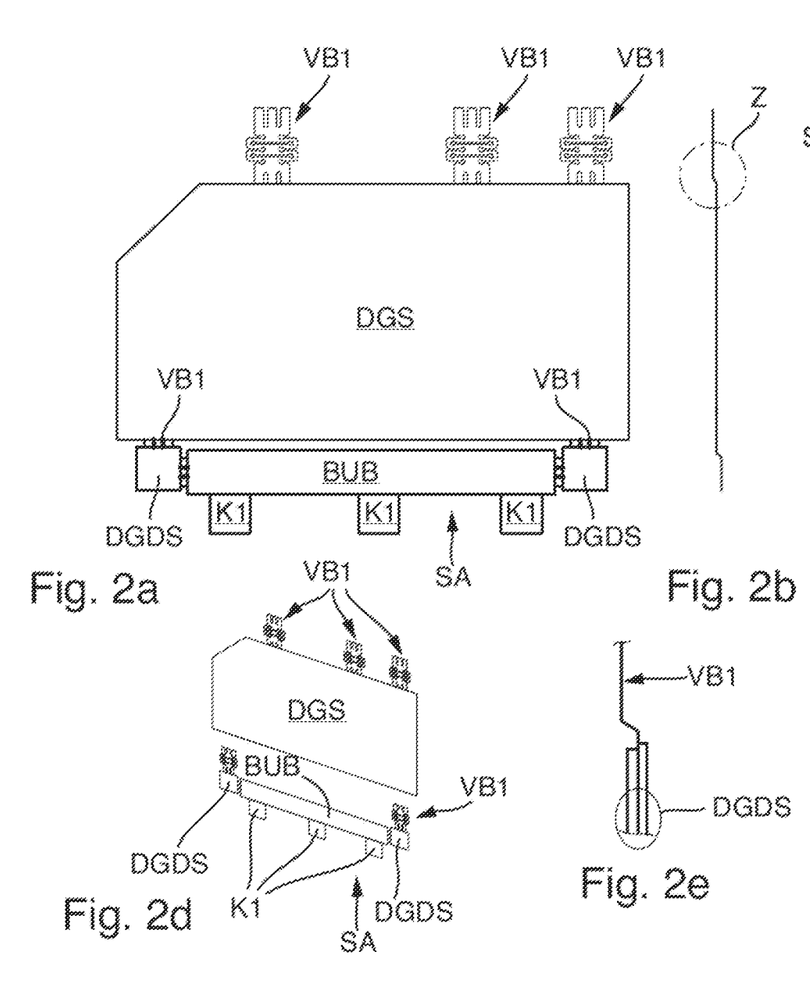
FIGS. 2a to 2e show detailed views, among other things, of the front, the side, and the back of the protection arrangement SA connected to a space solar cell WSZ.
Figure 2C:
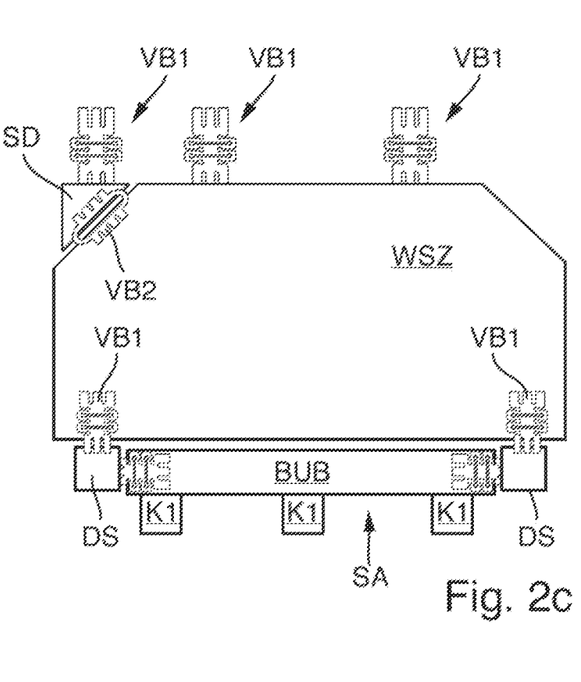

Specifically, FIG. 2*b* shows a side view, FIG. 2*c* shows a top view of the back, and FIG. 2*d* shows a perspective view of the arrangement in FIG. 2*a*.

FIG. 2*e* shows a section of a detailed side view of a string protection diode DGDS.

Only the differences from the preceding specific embodiments are explained below.

FIG. 2*a* shows the top view of the front of one of space solar cells WSZ, which is covered by a cover glass DGS. On one of the two ends, contact lugs K1 of a total of three of connectors VB1 are visible on an edge of space solar cell WSZ formed in the Y direction for the series connection to an adjacent space solar cell WSZ.

Connectors VB1 have a first contact surface and a second contact surface. One of the two contact surfaces of the three connectors VB1 is welded in each case to the upper side of space solar cell WSZ. The other contact surface is provided for a connection to a further space solar cell WSZ. In the present case, the two contact surfaces are provided with the same design.

The two contact surfaces include multiple contact lugs K1. The particular connecting pieces between particular two contact surfaces of connectors VB1 are provided with a meander-shaped design for the purpose of mechanically decoupling the particular two contact surfaces from each other.

Protection arrangement SA, including the two string protection diodes DGDS protected by the cover glass designed as a cover layer and metal strip BUB, is formed on the opposite long edge of space solar cell WSZ. It is understood that the cover glass is transparent in the infrared range.

A total of three contact lugs K1 are provided on metal strip BUB for connecting the flexible cables.

The thinness of string STRA, which is less than one millimeter, is apparent in the side view in FIG. 2*b*. In addition, a step is formed between metal strip BUB and contact lugs K1.

it is apparent from the back view of FIG. 2*c* that bypass diode SD is connected to the underside of space solar cell WSZ with the aid of a wide connector VB2. Protection arrangement SA is furthermore connected on the opposite edge with the aid of the contact surfaces of connectors VB1. It should be noted that wider connector VB2 has a different geometrical shape, in particular a greater width, than connector VB1.

It is apparent from the illustration in FIG. 2*e* that one of the two contact surfaces of connector VB1 is connected to the upper side of string protection diode DGDS and is covered by the cover glass. Connector VB1 furthermore has a step between the two contact surfaces.

Detailed views of protection arrangement SA and connectors VB and the structure of string protection diodes DGDS are shown in the illustrations in FIGS. 3*a* through 3*f*. Only the differences from the preceding illustrations are explained below.

It is apparent that the contact surfaces of connectors VB1 each include exactly three contact lugs. It is also apparent in the side view in FIG. 3*b* that the protection arrangement has a very thin design in the Z direction and preferably has a thickness of less than 1 mm.

Figure 3A:
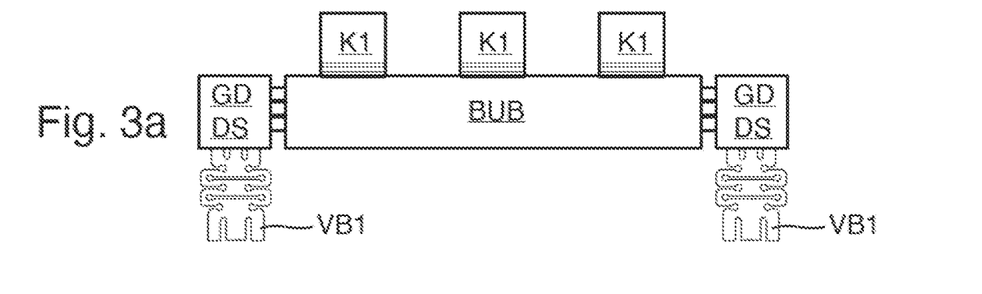
FIGS. 3a to 3f show different detailed views of the protection arrangement and the connectors, including string protection diodes.
Figure 3B:
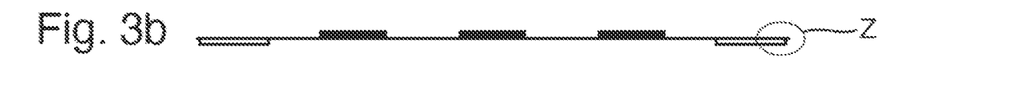
Figure 3C:
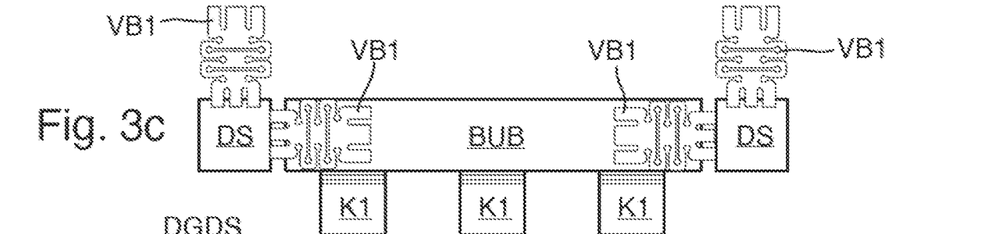
Figure 3D:
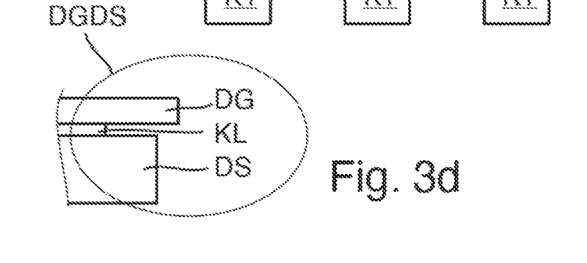
Figures 3E, 3F:
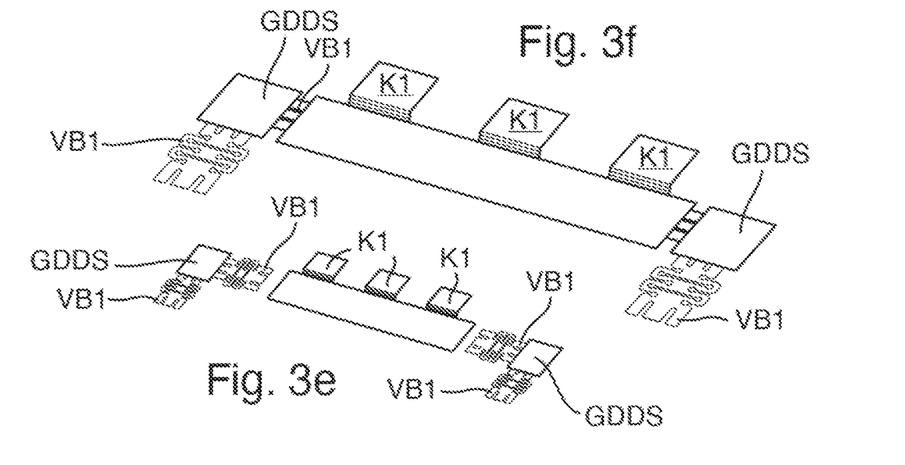

It is apparent in the enlargement of the section in FIG. 3*d* that a cover glass DG is arranged on the one side of string protection diode DGDS with the aid of an adhesive KL on one side of protection diode DS.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A protection of space solar cells in an arrangement in the form of a string, at least a portion of the space solar cells being arranged one after the other in the form of the string extending in an X direction, the string comprising:

at least two space solar cells;

two directly adjacent space solar cells in the X direction being electrically connected in series to each other via one or multiple metallic connectors, the space solar cells each comprising a receiving surface arranged in an X direction and in a Y direction;

a front and a back, with receiving surfaces of the space solar cells being formed on the front of the string;

a first end and a second end opposite the first end, the two ends each extending in a Y direction along a side of space solar cell arranged on the ends of the string;

wherein each space solar cell includes a bypass diode connected to the particular space solar cell, wherein each space solar cell has a thickness between 30 μm and 300 μm or a thickness between 50 μm and 160 μm in a Z direction, wherein a protection arrangement is formed on the front on at least one of the two ends along the Y direction, wherein the protection arrangement is electrically connected to the space solar cell of the string arranged on the end with the aid of one of the metallic connectors, wherein the protection arrangement comprises a first string protection diode and a metal strip and a second string protection diode, wherein the metal strip has a first head-side end and a connection piece and a second head-side end;

wherein, in a first alternative, the first string protection diode is connected in series in the Y direction to the first head-side end of the metal strip with the aid of one of the metal connectors, and the second string protection diode is connected in series in the Y direction to the second head-side end of the metal strip with via one of the metallic connectors, the connectors each having two contact surfaces spaced a distance apart by a connecting piece or, in a second alternative, the first string protection diode is arranged directly on the first head-side end of the metal strip and the second string protection diode is arranged directly on the second head-side end of the metal strip, wherein the two string protection diodes are each electrically connected in series in the X direction to the space solar cell arranged on the end of the string via one of the metallic connectors, wherein each string protection diode is uncased and has exactly one p/n junction and a metal contact on an upper side and a metal contact on an underside, the metal contacts each covering at least 50% of the total surface of the upper side and the underside, wherein each string protection diode has its own cover on the upper side, the cover being glued to the upper side;

wherein the protection arrangement is designed overall to be flat and has a thickness of less than 1 mm in a Z direction, and wherein the extension of the entire protection arrangement has an extension in the Y direction which is greater than in the X direction at least by a factor of five.

2. The arrangement of space solar cells according to claim 1, wherein the connectors have a first contact surface and a second contact surface, one of the two contact surfaces being connected to the metal contact on the underside or to the metal contact on the upper side of the string protection diode, and the other of the two contact surfaces being connected to the metal strip.

3. The arrangement of space solar cells according to claim 1, wherein, in the case of the connectors, the two contact surfaces are provided with the same or a different design.

4. The arrangement of space solar cells according to claim 1, wherein, in the case of the connectors, at least one of the two contact surfaces or both contact surfaces has/have a contact lug or multiple contact lugs in each case.

5. The arrangement of space solar cells according to claim 1, wherein, in the case of the connectors, the connecting piece between the two contact surfaces is provided with a meander-shaped design for the purpose of mechanically decoupling the two contact surfaces from each other.

6. The arrangement of space solar cells according to claim 1, wherein the two contact surfaces of the connectors are each provided with a flat design and each have a thickness formed in the Z direction between 0.01 mm and 0.7 mm.

7. The arrangement of space solar cells according to claim 1, wherein the connectors have a rectangular surface, and the long side of the rectangular surface has a greater extension than the short side at least by a factor of 5.

8. The arrangement of space solar cells according to claim 1, wherein the bypass diode is directly connected to the particular space solar cell with the aid of a wide connector.

9. The arrangement of space solar cells according to claim 1, wherein one of the two string protection diodes is connected directly to the bypass diode.

10. The arrangement of space solar cells according to claim 1, wherein a protection arrangement is formed on both ends of the string.

11. The arrangement of space solar cells according to claim 1, wherein, in the case of a light incidence on the front of the space solar cell, the current flows to the connecting line only through the string protection diodes and the metal strip.

12. The arrangement of space solar cells according to claim 1, wherein the contact lugs have a thickness between 0.01 mm and 0.5 mm or between 0.02 mm and 0.2 mm.

13. The arrangement of space solar cells according to claim 1, wherein the cover of the string protection diode is transparent in the infrared range for the purpose of reflecting the incident sunlight, and/or the cover is designed as a cover glass, and the upper side of the string protection diode has a continuous metallic layer or one formed over more than 80% of the surface for reflecting the solar radiation.

14. The arrangement of space solar cells according to claim 1, wherein the protection arrangement is formed directly on one of the two ends, the distance in the X direction between the protection arrangement and the space solar cell connected to the protection arrangement being in a range between 10 μm and 10 mm or in a range between 100 μm and 2 mm.

15. The arrangement of space solar cells according to claim 1, wherein a cooling for the string protection diodes is formed with the aid of the metal strips and/or the connecting line.

* * * * *